Jan. 16, 1951 R. I. WEBER 2,538,717

TUNING DEVICE FOR MULTIBAND RECEIVERS

Filed Sept. 28, 1949 2 Sheets-Sheet 1

RENNIE I. WEBER
INVENTOR.

BY Francis W. Crotty
HIS ATTORNEY

Jan. 16, 1951 R. I. WEBER 2,538,717

TUNING DEVICE FOR MULTIBAND RECEIVERS

Filed Sept. 28, 1949 2 Sheets-Sheet 2

RENNIE I. WEBER
*INVENTOR.*

BY Francis W. Crotty
HIS ATTORNEY

Patented Jan. 16, 1951

2,538,717

UNITED STATES PATENT OFFICE 2,538,717

TUNING DEVICE FOR MULTIBAND RECEIVERS

Rennie Irwin Weber, Chicago, Ill., assignor to Zenith Radio Corporation, a corporation of Illinois Application September 28, 1949, Serial No. 118,363

5 Claims. (Cl. 250—40)

This invention relates to tuning devices for radio receivers or the like, and more particularly to tuning devices of the type wherein sequential energization and de-energization of a solenoid causes step-by-step tuning of the receiver to certain preselected signal frequencies.

Tuning devices of the above-described type have been proposed for tuning a radio receiver in a plurality of signal bands. For example, by suitable preliminary adjustments, such devices may be adapted to tune a receiver to preselected signal frequencies in the amplitude-modulation signal band, and to other preselected signal frequencies in the frequency-modulation signal band. The chief disadvantage of these prior-art tuning devices is their inflexibility, since these devices are constructed to tune the receiver only to a certain predetermined number of signal frequencies in each of tthe signal bands.

The present invention provides a tuning device of the step-by-step type for tuning a radio receiver to preselected signal frequencies lying in more than one signal band. A feature of the tuning device of the present invention is its flexibility in that it is capable of tuning the receiver to a predetermined number of preselected signal frequencies, and at the will of an operator these signal frequencies may be derived in any desired proportion from a plurality of signal bands.

It is, accordingly, an object of the present invention to provide an improved tuning device for a radio receiver or the like, by means of which the receiver may be tuned sequentially to preselected signal frequencies lying in more than one signal band.

A further object of this invention is to provide an improving tuning device for a radio receiver or the like for tuning the receiver to preselected signal frequencies in a sequential fashion, and which includes means for enabling an operator to select the preselected signal frequencies from more than one signal band in any desired proportion.

A more particular object of this invention is to provide an improved device for sequentially tuning a combined frequency-modulation and amplitude-modulation receiver to certain preselected signal frequencies within an amplitude-modulation signal band and to certain preselected signal frequencies within a frequency-modulation signal band, separate and distinct from the amplitude-modulation signal band.

Figures 1, 4:
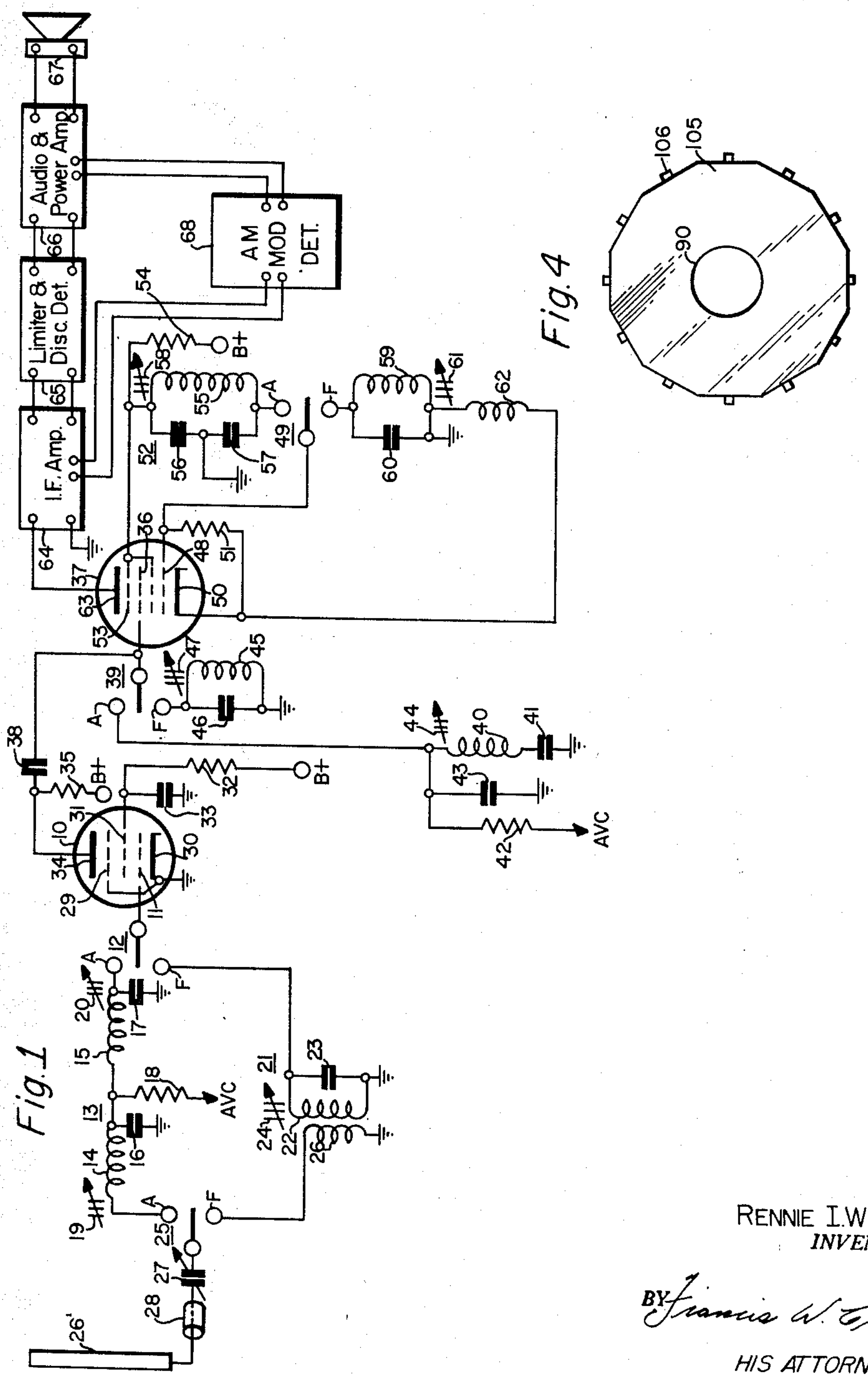
Figures 2, 3, 5:
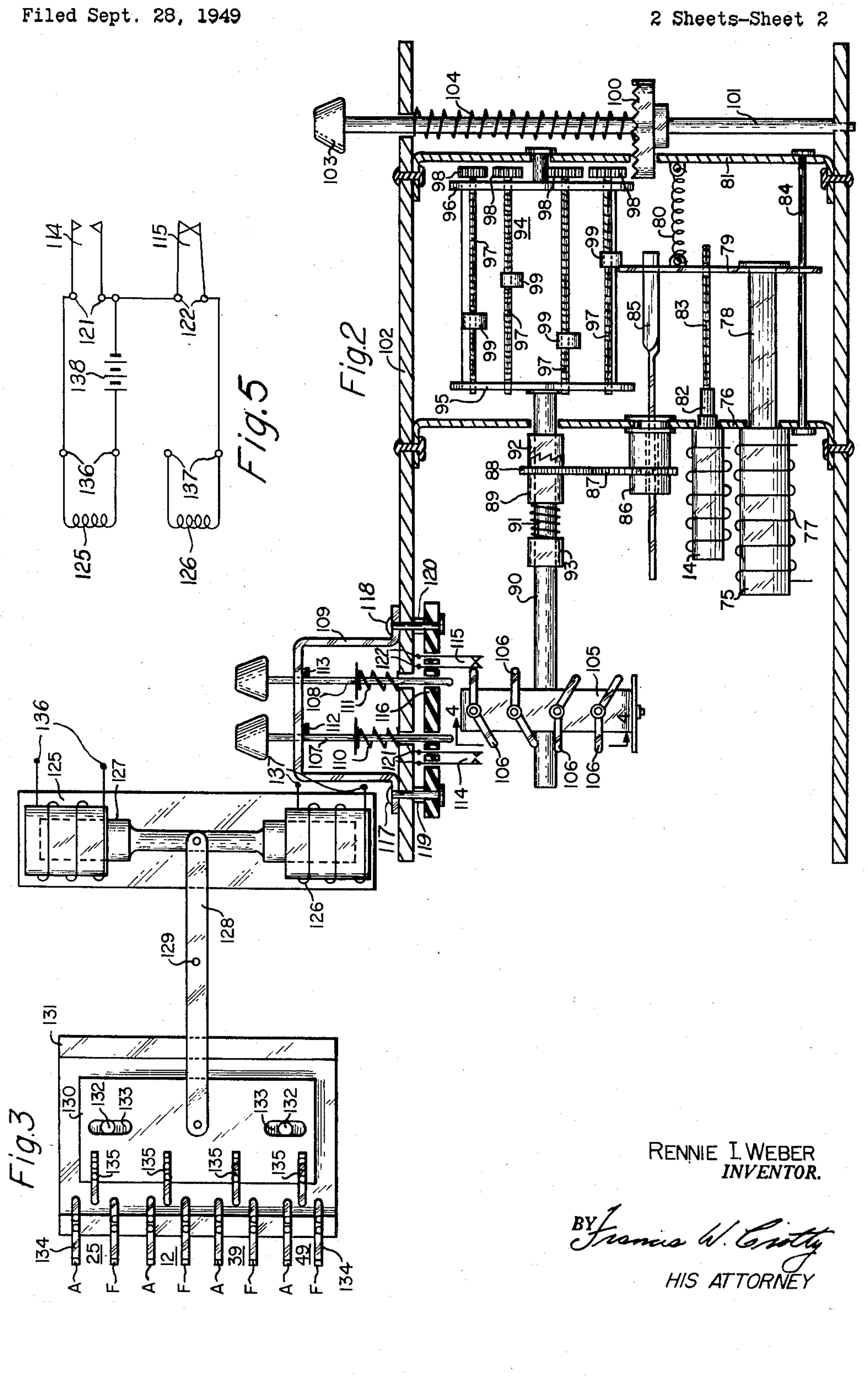

The features of this invention which are believed to be new are set forth with particularity in the appended claims. The invention itself, however, together with further objects and advantages thereof may best be understood by reference to the following description when taken in conjunction with the accompanying drawings, in which:

Figure 1 shows a circuit diagram of a combined frequency-modulation and amplitude-modulation receiver in which the present invention may be utilized, Figure 2 shows an embodiment of the tuning device of the present invention, Figure 3 shows a solenoid switching arrangement controlled by the tuning device of Figure 2, Figure 4 shows a view of one of the components of the device of Figure 2 taken along the lines 4—4, and Figure 5 shows an energizing circuit for the tuning device of the invention.

The combined frequency-modulation and amplitude-modulation receiver circuit of Figure 1 is disclosed and claimed in copending application Serial No. 110,547, filed August 16, 1949, in the name of Frank Pampel, entitled "Amplitude-Modulation and Frequency-Modulation Radio Receiver" and assigned to the present assignee. This circuit is included herein merely to illustrate one type of receiver circuit in which the present invention finds great utility. It will be apparent, however, that the present tuning device may be used in any system wherein it is desired to select automatically signal frequencies from more than one frequency range.

The circuit of Figure 1 includes an electron-discharge device 10 which is connected to form the radio-frequency amplifier of the receiver. The control electrode 11 of the device 10 is connected to the movable arm of a switch 12 which connects alternately with contacts indicated A and F associated with the switch. The contact A is connected to a tuned antenna circuit 13 comprising series-connected tuning elements in the form of inductance coils 14 and 15 coupled to ground respectively by capacitors 16 and 17. The junction of coils 14 and 15 is connected to an automatic-volume-control stage, not shown, through a resistor 18. The inductance coils 14 and 15 are variable as indicated by the symbols 19 and 20, and variation of the inductance of these coils tunes the circuit 13 through the amplitude-modulated signal frequency band. The contact F of switch 12 is connected to a tuned antenna circuit 21 which comprises a tuning element in the form of an inductance coil 22 and shunted by a capacitor 23, one side of the tuned circuit being connected to the contact and the other to ground. The coil 22 is variable as indicated by the symbol 24, and variation of the inductance of this coil tunes the circuit 21 through the frequency-modulated signal band.

A suitable antenna switch 25 similarly has a terminal F and a terminal A. Terminal A is connected to one extremity of the coil 14 of tuned circuit 13, and terminal F is connected through an inductance coil 26 to ground, the coil 26 being inductively coupled to coil 22 of tuned circuit 21. The movable arm of switch 25 may be coupled to a suitable antenna 26′ through a coupling capacitor 27 and coaxial-line section 28.

The suppressor electrode 29 of the device 10 is connected to the cathode 30 which, in turn, is connected to ground. The screen electrode 31 is connected to the positive terminal B+ of a source of unidirectional potential through a resistor 32, and is by-passed to ground through a capacitor 33. The anode 34 of the device 10 is connected to the positive terminal B+ of a source of unidirectional potential through a resistor 35 and is further coupled to the control electrode 36 of an electron-discharge-device 37 through a capacitor 38. The control electrode 36 is connected to the movable arm of a switch 39, this arm connecting alternately with contacts A and F associated with the switch. The contact A of switch 39 is connected to the junction of a tuning element inductance coil 40 and a capacitor 43, the capacitor 43 being connected to ground, and the coil 40 being coupled to ground through a capacitor 41. The contact A is also connected to an automatic volume control stage, not shown, through a resistor 42. The inductance coil 40 is variable as indicated by the symbol 44, and variation of the inductance of this coil tunes the network 40, 41 and 43 through the amplitude-modulation band. The contact F of switch 39 is coupled to ground through a tuned circuit comprising a tuning element inductance coil 45 shunted by a capacitor 46. The inductance coil 45 is variable, as indicated by the symbol 47, and variation of the inductance of this coil tunes the circuit 45, 46 through the frequency-modulation band.

A further control electrode 48 of the device 37 is connected to the movable arm of a switch 49, and to the cathode 50 of this device through a grid-leak resistor 51. The movable arm of switch 49 connects alternately with contacts A and F associated with this switch. The contact A is connected to one side of a frequency-determining and feedback network 52, the other side of this network being connected to the electrode 53 of device 37 which is utilized as an anode, in a manner to be described, and to the positive terminal B+ of a source of unidirectional potential through a resistor 54. The network 52 comprises a tuning element inductance coil 55 shunted by a pair of series-connected capacitors 56 and 57, the junction of capacitors 56 and 57 being connected to ground. The capacitor 56 has an additional function in that it acts as a by-pass capacitor to ground for radio-frequency and intermediate-frequency signals appearing on the electrode 53 of device 37. The inductance coil 55 is variable, as indicated by the symbol 58. The contact F of the switch 49 is connected to ground through a tuned circuit comprising a tuning element inductance coil 59 shunted by a capacitor 60, inductance coil 59 being variable as indicated by the symbol 61. The cathode 50 of device 37 is connected to ground through a feedback inductance coil 62 which is inductively coupled to the coil 59.

The anode 63 of device 37 is connected to an intermediate-frequency amplifier 64 of any desired number of stages. The amplifier 64 is coupled to a limiter and discriminator-detector stage 65 which, in turn, is connected to a unit 66 containing any desired number of audio and power amplifier stages. The output terminals of the unit 66 are coupled to a sound reproducing device 67. The intermediate-frequency amplifier 64 is further connected to an audio modulation detector 68, the output terminals of which are connected to the unit 66. The intermediate-frequency amplifier 64 includes frequency-selective input and output networks, whereby the frequency-modulated intermediate-frequency signal is amplified and directed to the unit 65 wherein it is amplitude-limited and detected; on the other hand the amplitude-modulated intermediate-frequency signal is amplified and directed to the detector unit 68 wherein this latter signal is detected. The circuit connections of the units 64, 65, 66 and 68 are well-known, and the particular example illustrated is by way of an example only as any suitable arrangement may be utilized.

In practice, the switches 12, 25, 39 and 49 are mechanically interconnected for uni-control movement of their movable members to effect simultaneous and selective connection of these members as between the contacts A and contacts F. Similarly the tuning elements of the inductance coils 14, 15, 40 and 55 are mechanically coupled for simultaneous tuning of the various tuned circuits associated therewith. Furthermore, the tuning elements of the inductance coils 22, 45 and 59 are mechanically coupled for simultaneous tuning of the tuned circuits associated with these coils.

It will be assumed initially that the receiver circuit is conditioned for the reception of frequency-modulated signals in the frequency-modulation band. Accordingly, the switches 12, 25, 39, and 49 are actuated so that their movable members connect with the respective contacts F. The frequency-modulated signals intercepted by the antenna 26 are then supplied to the tuned circuit 21 by means of the coil 26. The circuit 21 may be tuned to select a desired one of the frequency-modulated signals, and the selected signal is amplified in the device 10. The circuit 45, 46 is simultaneously tuned to the selected signal and the amplified signal is applied to the control electrode 36 of the device 37.

The electrodes 53, 48, and 50 of the device 37 are connected to form the oscillator section of a heterodyning circuit, oscillations being sustained in this section by reason of the feedback provided to the grid-cathode circuit by the coil 62 which, as previously stated, is inductively coupled to the coil 59. The network 59, 60 forms the frequency-determining network of this oscillator section and the frequency of the heterodyning signal generated thereby is varied by variation of the inductance coil 59. As previously stated, the tuning element of the coil 59 is mechanically coupled to the tuning elements of the coils 22 and 45, so that all the frequency-modulated signals selected by the tuning circuit 21 and amplified by the device 10, are heterodyned in the device 37 and appear in the anode circuit thereof at a certain predetermined intermediate frequency. This intermediate-frequency signal is amplified in the intermediate-frequeny amplifier 64 and amplitude-limited and detected in the unit 65. The resulting audio signal is amplified in the unit 66 and applied to the reproducing device 67 for reproduction therein.

It will now be assumed that the receiver circuit is to be conditioned for the reception of signals in the amplitude-modulation band. To that end, the switches 12, 25, 39, and 49 are actuated so that their movable members connect with the respective contacts A. The amplitude-modulated signals intercepted by the antenna 26 are then supplied to the tuned network 13 through the switch 25. The network 13 may be tuned to select a desired one of these amplitude-modulated signals, and the selected signal is amplified in the device 10. The circuit 40, 41 is simultaneously tuned to the selected signal and the amplified signal is applied to the control electrode 36 of the device 37.

The switch 49 is now in a position where the control electrode 48 of the device 37 is connected through the contact A to one side of the network 52. The electrodes 53, 48, and 50 of the device 37 are now connected into a second oscillator section of the heterodyne stage including the network 52. The cathode 50 is in effect connected to ground for the amplitude-modulated signals since the heterodyning-signal frequency range utilized for these signals is low relative to the range utilized for the frequency-modulated signals, and the coil 62 presents negligible inductive reactance to the heterodyning signals in the former range.

The network 52 forms the frequency-determining and feedback circuit for this oscillator section and the frequency of the heterodyning-signal generated thereby may be varied by adjustment of the tuning element 58 of coil 55. The tuning element 58 of coil 55 is mechanically coupled to the tuning elements of coils 14, 15 and 40 so that all the amplitude-modulated signals selected by the tuned circuit 13 and amplified by the device 10 are heterodyned in the device 37 and appear in the anode circuit thereof with a fixed intermediate frequency that is distinct from the intermediate frequency of the frequency-modulated signals.

The amplitude-modulated intermediate-frequency signal produced by the device 37 is amplified in the intermediate-frequency amplifier 64 and directed to the amplitude-modulation detector 68 wherein it is detected and the resulting audio signal is amplified in the unit 66 and reproduced in the device 67.

The tuning device of the present invention is illustrated in Figure 2 and may be utilized to tune the receiver circuit of Figure 1 to various preselected signal frequencies in the amplitude-modulation band of the receiver, and automatically to actuate the switches 12, 25, 39 and 49 and tune the receiver to various preselected signal frequencies in the frequency-modulation band.

The device of Figure 2 includes a solenoid assembly 75 mounted on a bracket 76 and including a coil 77 and a plunger 78. An arm 79 is mounted on the plunger 78 and urged to the right of the drawing by means of a resilient spring 80 fixed to a bracket 81. The inductance coils 14, 15, 22, 40, 45, 55, and 59 of Figure 1 are mounted on the bracket 76, one such coil 14 being shown in Figure 2. The coil 14 is tuned by a core 82 which is coupled to the arm 79 by means of a flexible member 83, threaded to the arm 79. The inductance coils 15, 22, 40, 45, 55 and 59 are tuned by similar cores (not shown) which are also coupled to the arm 79 by means of associated flexible members. The arm 79 is slidably mounted on a supporting rod 84 extending between the brackets 76 and 81.

A twisted drive strip 85 is fixed to the arm 79 and extends through a cooperating slot in a member 86 rotatably mounted on the bracket 76. The member 86 has a gear 87 attached thereto, and when the drive strip 85 moves into the slot of member 86 the gear 87 is rotated a certain amount in one direction, and when the strip moves out of the slot of member 86 the gear is rotated a certain amount in the opposite direction. The gear 87 is in meshing engagement with a further gear 88 fixed to a member 89. The member 89 is rotatably mounted on a shaft 90 extending through and supported by the bracket 76. The member 89 has ratchet teeth at one end, and is yieldably urged by means of a spring 91 into engagement with a further member 92 having cooperating ratchet teeth and fixed to the shaft 90, the spring 91 being anchored to a member 93 fixed to the shaft 90.

A tuning mechanism in the form of a turret 94 is mounted on the shaft 90 and is rotatable thereby into sequential tuning positions, in a manner to be described. The turret includes a pair of end brackets 95 and 96 having a plurality of threaded rods 97 individually corresponding to a predetermined number of tuning positions of the turret and longitudinally extending between these brackets. Each of the rods 97 may be rotated by means of a pinion gear 98 mounted at one end thereof, and each rod has a dog 99 threaded thereon. The dogs 99 are prevented from rotating by means of suitable backing strips (not shown) so that rotation of a gear 98 causes a corresponding dog 99 to move along its associated rod. Each of the dogs 99 may be given a desired position on its associated rod 97 by means of an adjusting arrangement including a crown gear 100. The gear 100 is fixed to a shaft 101 extending through a panel 102 and rotated by means of a knob 103. The gear 100 is normally urged out of engagement with the respective gears 98 by means of a resilient spring 104. However, the shaft 101 may be moved longitudinally to bring the gear 100 into selective engagement with the gears 98 for the various sequential tuning positions of the turret 94 to adjust the position of the various dogs 99 for a purpose to be described.

The shaft 90 also carries a switching mechanism including a drum 105 fixed to the shaft and this drum has a plurality of movable pivoted switch-operating members or arms 106 mounted about its periphery corresponding to each of the sequential tuning positions of the turret 94. The view of the drum 105 taken along the lines 4—4 is shown in Figure 4. A pair of push rods 107 and 108 are mounted on a bracket 109 which, in turn, is mounted on the panel 102. The two push rods are urged upwards by means of springs 110 and 111, stops 112 and 113 being provided on the respective rods to bear against the bracket 109 and limit the upward motion of the rods. The arms 106 may be pre-set in either one of two positions for each tuning position of the turret 94 by depressing either the rod 107 or the rod 108. A pair of electrical contacts 114 and a further pair of electrical contacts 115 having respective connecting terminals 121, 122 are mounted on a bracket 116 of insulating material which, in turn, is mounted on the panel 102 by means, for example, of a pair of screws 117, 118 and associated tubular spacers 119, 120. The contacts 114 are so disposed that any of the arms 106 which are pre-set in the first position by the rod 108 closes these contacts for certain tuning positions of the turret 94. On the other hand, the contacts 115 are so disposed that any of the arms 106 which are pre-set in the second position by the rod 107 close these contacts for other tuning positions of the turret 94.

Energization of the coil 77 of the solenoid 75 causes the plunger 78 to be drawn into the coil and the arm 79 to move to the left in the drawing against the tension of the spring 80. This movement of the arm 79 causes the tuning core 82 and other tuning cores (not shown) to move into the coil 14 and the twisted drive strip 85 to move into the slot of member 86. Movement of the drive strip 85 into the member 86 causes this member to rotate which, in turn, causes the gear 87 to rotate the gear 88 in a first direction. Rotation of the gear 88 in this first direction causes the member 89 to rotate freely about shaft 90 due to the ratchet coupling of the members 89 and 92, and therefore the turret 94 does not rotate. De-energization of the coil 77 allows the spring 80 to draw the arm 79 to the right of the drawing. This causes the drive strip 85 to be withdrawn from the slot of member 86 and the member rotates in the opposite direction causing the gear 87 to drive the gear 88 in a second direction. Rotation of the gear 88 in this second direction causes the member 89 to drive the member 92 through the ratchet coupling arrangement and, hence, rotate the shaft 90 and turret 94 from one tuning position to the succeeding tuning position. Subsequent movement of the arm 79 to the right of the drawing is arrested by a dog 99 corresponding to the succeeding tuning position and, as previously described, the position of this dog may be adjusted so that the arm 79 comes to a stop when the core 82, and the other cores not shown, have predetermined positions in their associated inductance coils. In this manner, sequential energization and de-energization of the solenoid 74 adjusts the turret to a plurality of angular positions, each position causing the cores in the tuning coils of the receiver to have certain predetermined positions, preselected by adjustment of the various dogs 99 along their associated threaded rods 97. Individual cores may be adjusted for tracking purposes by rotating the threaded rod 83 and similar coupling rods (not shown).

As previously described, the arms 106 on the drum 105 may be pre-set to close either the contacts 114 or the contacts 115 for each tuning position of the turret 94. In a manner to be described, closure of the contacts 114 connects the frequency-modulation coils 22, 45 and 59 of Figure 1 into the receiver circuit, and closure of the contacts 115 connects the amplitude-modulation coils 14, 15, 40 and 55 into the receiver circuit.

The contacts 114 and 115 respectively control the energization of the solenoids 125 and 126 of a switching arrangement shown in Figure 3, the solenoids having associated connecting terminals 136, 137. The arrangement of Figure 3 includes a plunger 127 adapted to be drawn into the solenoid 125 or alternately into the solenoid 126, depending upon which solenoid is energized. The plunger 127 remains in the position to which it has been placed by either solenoid until the other solenoid is energized to displace the plunger to its alternate position. This plunger is coupled to a strip 128 which, in turn, is pivoted at a point 129. The pivoted strip 128 is coupled to a sliding member 130 constructed, preferably, of insulating material and supported on a base member 131, the base member also being constructed in insulating material. The sliding member 130 is supported on the base member by means of pins 132 extending into slots 133 in the sliding member.

A plurality of pairs of fixed contacts 134 are mounted on the base 131, and a plurality of moving contacts 135 are mounted on the sliding member 130 and arranged to connect with one or the other of the fixed contacts 134 of the respective pairs. These contacts make up the switches 12, 25, 39 and 49 of Figure 1, and energization of the solenoid 125 causes these switches to be connected for frequency-modulation reception, and on the other hand, energization of the solenoid 126 causes these switches to be connected for amplitude-modulation reception.

As pointed out, each individual setting of the tuning device may be adjusted for frequency-modulation or for amplitude-modulation reception by depressing the push rod 107 or 108 thereby pre-setting the various arms 106. This adjustment determines which of the solenoids 125 or 126 is to be energized for the corresponding setting of the tuning device and, therefore, whether the receiver is to be conditioned for frequency-modulation or for amplitude-modulation reception for this control setting. Once the desired selections have been made, sequential energization and de-energization of the coil 77 by means of a footswitch or other suitable switching device in the energizing circuit of this coil causes the tuning device to tune the receiver to selected signal frequencies within either the frequency-modulation or the amplitude-modulation signal band.

The energizing circuit for solenoids 125, 127 is shown in Figure 5. Terminals 136 of coil 125 are connected to terminals 121 of contacts 114 through an energizing potential source 138. Likewise, terminals 137 of coil 126 are connected to terminals 122 of contacts 115 through the energizing source. In this manner, whenever contacts 114 are closed, coil 125 is energized and whenever contacts 115 are closed, coil 126 is energized.

The invention provides, therefore, a tuning device in which a group of coils, such as the coil 14, for tuning the receiver in a first signal band, and a group of coils for tuning the receiver in a second signal band, are mounted on the bracket 76. A preliminary adjustment is made to the flexible coupling rods, such as the rod 83, to provide the proper tracking relation of the individual coils in the two groups. To preselect a desired signal frequency in the first signal band, for example; the receiver is turned on; the push-button 107 is depressed to close contacts 115 and connect the first group of coils into the receiver circuit; the rod 104 is pulled out and knob 103 rotated until the associated dog 99 causes the receiver to be tuned to the desired signal frequency, and the rod 104 is pushed in.

A second preselected signal frequency may be preselected by energizing and de-energizing the coil 77 of the solenoid assembly 75 and repeating the same procedure, depression of either push button 107 or 108 determining the signal band from which the signal frequency is to be preselected. In this manner, a predetermined number of signal frequencies may be preselected from either of the signal bands, and in any desired proportion.

While a particular embodiment of the invention has been shown and described modifications may be made, and it is intended in the appended claims to cover all such modifications as fall within the true spirit and scope of the invention.

I claim:

1. A tuning device for a multi-band receiver having a first group of adjustable tuning elements for tuning said receiver in a first signal band and a second group of adjustable tuning elements for tuning said receiver in a second signal band, comprising: a tuning mechanism operable into a plurality of tuning positions for actuating said tuning elements to tune said receiver to preselected signal frequencies in said first and second signal bands; a switching mechanism for determining the operating signal band of said receiver for each tuning position of said tuning mechanism and including a plurality of switch-operating members corresponding individually to each of the tuning positions of said tuning mechanism; means for pre-setting each of said switch-operating members into a selected one of two positions to connect a selected one of said groups of tuning elements into circuit with said receiver for each of said tuning positions of said tuning mechanism; and a driving mechanism mechanically coupled to said tuning mechanism and to said switching-mechanism for actuating said tuning mechanism to any desired one of its tuning positions to tune said receiver to a preselected signal frequency in a preselected one of said signal bands.

2. A tuning device for a multi-band receiver having a first group of adjustable tuning elements for tuning said receiver in a first signal band and a second group of adjustable tuning elements for tuning said receiver in a second signal band, comprising: a turret tuning mechanism rotatable into a plurality of tuning positions for actuating said tuning elements to tune said receiver to preselected signal frequencies in said first and second signal bands; a switching mechanism mechanically coupled to said turret for determining the operating signal band of said receiver for each tuning position of said turret and including a plurality of switch-operating arms corresponding individually to each of the tuning positions of said turret; means for presetting each of said switch-operating arms into a selected one of two positions to connect a selected one of said groups of tuning elements into circuit with said receiver for each of said tuning positions of said turret; and a driving mechanism mechanically coupled to said turret and to said switching mechanism for actuating said turret to any desired one of its tuning positions to tune said receiver to a preselected signal frequency in a preselected one of said signal bands.

3. A tuning device for a multi-band receiver having a first group of adjustable tuning elements for tuning said receiver in a first signal band and a second group of adjustable tuning elements for tuning said receiver in a second signal band, comprising: a housing for said device; a rotatable shaft mounted on said housing; a turret tuning mechanism mounted on said shaft and rotatable thereby into a plurality of tuning positions for actuating said tuning elements to tune said receiver to preselected signal frequencies in said first and second signal bands; a switching mechanism also mounted on said shaft for determining the operating signal band of said receiver for each tuning position of said turret and including a plurality of switch-operating members corresponding individual to each of the tuning positions of said turret; means for pre-setting each of said switch-operating members into a selected one of two positions to connect a selected one of said groups of tuning elements into circuit with said receiver for each of said tuning positions of said turret; and a driving mechanism mechanically coupled to said shaft for actuating said turret sequentially to any desired one of its tuning positions to tune said receiver to a preselected signal frequency in a preselected one of said signal bands.

4. A tuning device for a multi-band receiver having a first group of adjustable tuning elements for tuning said receiver in a first signal band and a second group of adjustable tuning elements for tuning said receiver in a second signal band, comprising: a turret tuning mechanism rotatable into a plurality of tuning positions for actuating said tuning elements to tune said receiver to preselected signal frequencies in said first and second signal bands; a switching mechanism mechanically coupled to said turret for determining the operating signal band of said receiver for each tuning position of said turret and including, a rotatable drum, and a plurality of switch-operating arms spaced about the periphery of said drum in positions corresponding individually to each of the tuning positions of said turret; means for pre-setting each of said switch-operating arms into a selected one of two operating positions to connect a selected one of said groups of tuning elements into circuit with said receiver for each of said tuning positions of said turret; and a driving mechanism mechanically coupled to said turret and to said switching mechanism for actuating said turret to any desired one of its tuning positions to tune said receiver to a preselected signal frequency in a preselected one of said signal bands.

5. A tuning device for a multi-band receiver having a first group of adjustable tuning elements for tuning said receiver in a first signal band and a second group of adjustable tuning elements for tuning said receiver in a second signal band, comprising: a turret tuning mechanism rotatable into a plurality of tuning positions for actuating said tuning elements to tune said receiver to preselected signal frequencies in said first and second signal bands; a switching mechanism mechanically coupled to said turret for determining the operating signal band of said receiver for each tuning position of said turret and including, a rotatable drum, and a plurality of switch-operating arms spaced about the periphery of said drum in positions corresponding individually to each of the tuning positions of said turret; a control circuit including a first and second pair of electrical contacts for connecting a selected one of said groups of tuning elements into circuit with said receiver upon actuation of a selected one of said pairs of electrical contacts; a pair of push rod for pre-setting each of said switch-operating arms into a selected one of two operating positions to actuate a selected one of said pairs of electrical contacts; and a driving mechanism mechanically coupled to said turret and to said switching mechanism for actuating said turret to any desired one of its tuning positions to tune said receiver to a preselected signal frequency in a preselected one of said signal bands.

RENNIE IRWIN WEBER.

REFERENCES CITED

The following references are of record in the file of this patent:

UNITED STATES PATENTS

| Number | Name | Date |
|---|---|---|
| 2,433,805 | Wolff | Dec. 30, 1947 |